United States Patent [19]
Moore et al.

[11] Patent Number: 5,867,020
[45] Date of Patent: Feb. 2, 1999

[54] CAPACITIVELY COUPLED RF VOLTAGE PROBE HAVING OPTIMIZED FLUX LINKAGE

[75] Inventors: James A. Moore, Powell; Dennis O. Sparks, Maryville, both of Tenn.

[73] Assignee: Sematech, Inc., Austin, Tex.

[21] Appl. No.: 742,392

[22] Filed: Oct. 31, 1996

[51] Int. Cl.⁶ .................................................. G01R 27/26
[52] U.S. Cl. ........................... 324/95; 324/658; 324/686; 324/690; 324/126
[58] Field of Search ................. 324/95, 658, 660, 324/686, 687, 690, 126, 127; 174/142, 143

[56] References Cited

U.S. PATENT DOCUMENTS

| | | | |
|---|---|---|---|
| 3,798,541 | 3/1974 | Campbell, Jr. et al. | 324/72.5 |
| 4,476,447 | 10/1984 | Lauchner | 333/111 |
| 4,801,866 | 1/1989 | Wixley | 324/754 |
| 5,325,019 | 6/1994 | Miller et al. | 315/111.21 |
| 5,467,013 | 11/1995 | Williams et al. | 324/127 |
| 5,472,561 | 12/1995 | Williams et al. | 156/627.1 |

OTHER PUBLICATIONS

"A Handbook Series on Electromagnetic Interference and Compatibility, vol. 3;" Donald R.J. White; Don White Consultants, Inc.; 1973, 1981; primarily pp. 9.26–9.27.

*Primary Examiner*—Ernest F. Karlsen
*Assistant Examiner*—Russell M. Kobert

[57] ABSTRACT

An RF sensor having a novel current sensing probe and a voltage sensing probe to measure voltage and current. The current sensor is disposed in a transmission line to link all of the flux generated by the flowing current in order to obtain an accurate measurement. The voltage sensor is a flat plate which operates as a capacitive plate to sense voltage on a center conductor of the transmission line, in which the measured voltage is obtained across a resistance leg of a R-C differentiator circuit formed by the characteristic impedance of a connecting transmission line and a capacitance of the plate, which is positioned proximal to the center conductor.

17 Claims, 11 Drawing Sheets

CAPACITIVELY COUPLED RF VOLTAGE PROBE HAVING OPTIMIZED FLUX LINKAGE

United States Government has rights in this invention pursuant to Cooperative Research And Development Agreement ("CRADA") No. 01082, among SEMATECH INC., SANDIA CORPORATION and LOCKHEED MARTIN ENERGY RESEARCH CORPORATION.

BACKGROUND OF THE INVENTION

1. Field of the Invention

The present invention relates to the field of sensing equipment and, more particularly, to a technique of measuring RF voltage and current.

2. This application is related to patent application Ser. No. 08/742,393; filed Oct. 31, 1996, now pending; and titled "RF Current Sensor."

3. Background of the Related Art

In the area of radio frequency (RF) signal monitoring, the art abounds with various devices and techniques for measuring an RF signal. However, for a sensor to have consistent accuracy that can be relied upon without resorting to systematic calibration of the sensor, the sensor should operate upon characteristics defined by first principles. The first principle standards operate on properties that are calculated from elemental physical characteristics. One such example is the zero-state transition of Cesium, which is used as a time standard. In RF terms, the RF current would be measured by determining the magnetic field that surrounds the conductor carrying the RF power. The RF voltage would be measured by a resistive or capacitive probe positioned on or near the power conductor.

In the processing of semiconductor wafers, reactors (such as plasma reactors) are used to process the wafers. One such use of reactors is in etching a layer(s) formed on a wafer. In employing this technique, electrical power is coupled to the reactor from an electrical source. Typically, this electrical energy has a frequency in the RF range. Generally, reactor process parameters are determined by measuring and monitoring the numerous parameters, one of which is the measuring of the RF power. RF power is determined by measuring the RF voltage (V) and the RF current (I) components of the RF power coupled to the reactor. It is generally desirable to obtain the V and I measurements as close to the reactor as possible in order to obtain a true representation of the actual RF V and I values entering the reactor. Thus, a common practice for measuring RF power (V * I, where * is the mathematical operator denoting the scalar product of the voltage and current vectors) is by installing a V and I sensor in series with the transmission medium coupling the RF power to the reactor.

By utilizing a voltage "pick-off" probe and a current "pick-off" probe, a sample of the V & I from the transmission medium (such as a transmission line or a waveguide) can be obtained. For voltage pick-off, a common practice is to use a voltage divider circuit coupled to the transmission line. For current "pick-off", a common practice is to use a coil (wire loop) positioned adjacent to a driven conductor of a transmission line, in order to obtain a sample of the magnetic flux generated around the transmission line. One such RF V and I sensor (or monitor) is described in U.S. Pat. No. 5,467,013.

As stated earlier, it is difficult to obtain accurate measurements consistently and repeatedly. One reason is associated with the calibration of the sensor and another reason is associated with some mismatch of impedance encountered between the "pick-off" device and the measuring device. Sometimes, such sensors are intrusive and can disrupt the on-going process. For example, with current sensors, the calibration of the measurement depends on the amount of flux "cutting" across the pick-off coil. Accordingly, where not all flux lines cut across the pick-off coil, the sensor must be calibrated for this leakage flux.

In reference to the mismatch of impedance between the pick-off circuit and the measuring device, it is desirable to reduce such a mismatch as small as possible. Accordingly, it is the practice to have the measuring device or instrument as close as possible in distance to the sensor. However, there typically still is some amount of mismatch associated with the pick-off circuitry. Thus, some amount of measurement error is associated with this mismatch in prior art sensors.

The present invention attempts to rely more on the first principles to remove or significantly reduce the amount of error introduced in an RF sensor.

SUMMARY OF THE INVENTION

The present invention describes an RF sensor having a novel current sensing probe and a voltage sensing probe to measure voltage and current. The RF sensor is placed serially in line with a coaxial transmission line so that a center conductor of the RF sensor is coupled to the center conductor of the transmission line. The RF sensor is enclosed in a housing, which becomes part of the return path of the transmission line. The center conductor is cylindrical in shape and the interior surface of the housing is also made cylindrical, so that the two conductors form two concentric surfaces separated by an air dielectric and having an impedance to match that of the main transmission line.

The center conductor of the sensor is made hollow and skin effect insures that current flow is along its outer surface. An opening is present along a portion of the center conductor for receiving a portion of the current sensing probe of the present invention. The current probe is comprised of a single loop of a coil formed from another transmission line. The center conductor of the coil is terminated in its characteristic impedance at both ends. The outer shielding of the coil loop is grounded at both ends. A cut (or a slit) is made in the outer shielding at the midway point wherein the outer conductor of the coil operates as a Faraday Shield, so that the origin of the signal obtained from the current probe is purely inductive. Since all of the flux field induced by the current resides only between the inner and outer conductors of the RF sensor, the current probe will link all of the generated flux. Therefore, by knowing the physical parameters of the current probe, an accurate current measurement can be obtained without the need for intricate calibration procedures.

The voltage sensing probe is a flat plate which operates as a capacitive plate to sense voltage on the center conductor of the RF sensor. The plate is positioned proximal to the center conductor and is capacitively coupled to the center conductor and to the concentric wall of the sensor housing. However, due to the proximity of the plate to the center conductor and the exposed back of the plate, electric flux lines proximal to the point of measurement are mostly coupled to the plate. Very little electric flux linkage is to the outer conductor in the vicinity of the sensing point. The plate is also a termination point for a characteristic impedance of another transmission line, so that the measured voltage is obtained across the characteristic impedance of the transmission line, which is the resistive leg of a R-C differentiator circuit formed by the characteristic impedance and the capacitive reactance of the plate to the center conductor.

DETAILED DESCRIPTION OF THE PREFERRED EMBODIMENTS

A voltage and current sensor having improved accuracy over prior art sensors is described. In the preferred embodiment, the voltage and current sensors are respectively utilized to vectorially measure voltage (V) and current (I) in the radio frequency (RF) range. In the following description, numerous specific details are set forth, such as specific devices, components, measuring techniques, etc., in order to provide a thorough understanding of the present invention. However, it will be appreciated by one skilled in the art that the present invention may be practiced without these specific details. In other instances, well known techniques and structures have not been described in detail in order not to obscure the present invention. It is to be noted that a preferred embodiment of the present invention is described having both voltage and current probes packaged in a single sensor housing where V and I samples are obtained at about the same location on the transmission line for determining RF power supplied to a reactor.

Figure 1:
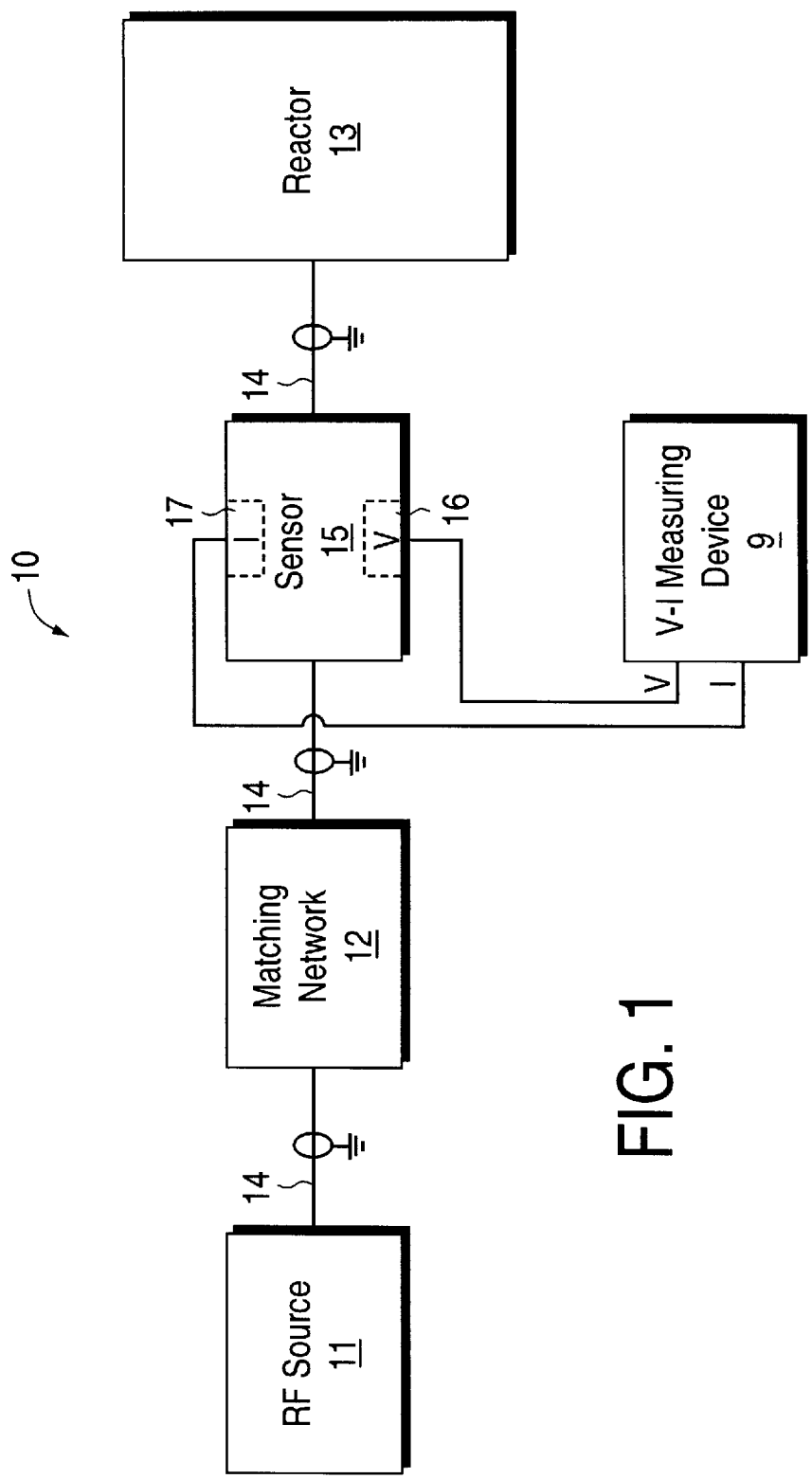
FIG. 1 is a circuit block diagram showing an exemplary reactor system and a placement of an RF sensor of the present invention within the system for measuring RF voltage and current entering the reactor.

Referring to FIG. 1, a block diagram showing a utilization of an RF sensor of the present invention is shown. In this exemplary system 10, an electrical source in the form of an RF generator 11 (RF source) is coupled to a processing reactor 13 through a matching network 12 by transmission line 14. The reactor 13 can be of a variety of reactors, such as a plasma reactor, for processing a variety of materials, including semiconductor wafers. It is appreciated that a variety of processing systems utilizing electrical or microwave energy (including RF) sources are known in the art and one of them can be readily substituted for the system 10. Furthermore, the use of the matching network 12 is preferred, but not necessarily needed to use the sensor of the present invention.

As shown in FIG. 1, a sensor unit 15 of the present invention is inserted serially in the transmission line 14 (which is typically coaxial), proximal to the reactor 13 and preferably disposed after the matching network 12. It is preferred to have the sensor 15 in close proximity to the reactor 13 as possible, so that the measurements obtained from sensor 15 are indicative of actual V and I values entering the reactor 13. The sensor 15 of the present invention is actually comprised of two sensors, one for measuring voltage and the other for measuring current. The RF voltage is sensed by a voltage probe assembly 16 (hereinafter referred to as the voltage sensor or voltage probe) and RF current is sensed by a current probe assembly 17 (hereinafter referred to as the current sensor or current probe), both encased within a housing. Both V and I values are sensed at substantially the same point on the transmission line 14 within the sensor 15 in order to determine the power entering the reactor 13 and in some instances, a phase relationship between the V and I. The V and I outputs from the sensor 15 are coupled to a voltage and current measuring device 9, which may be a vector voltmeter.

Figure 2:
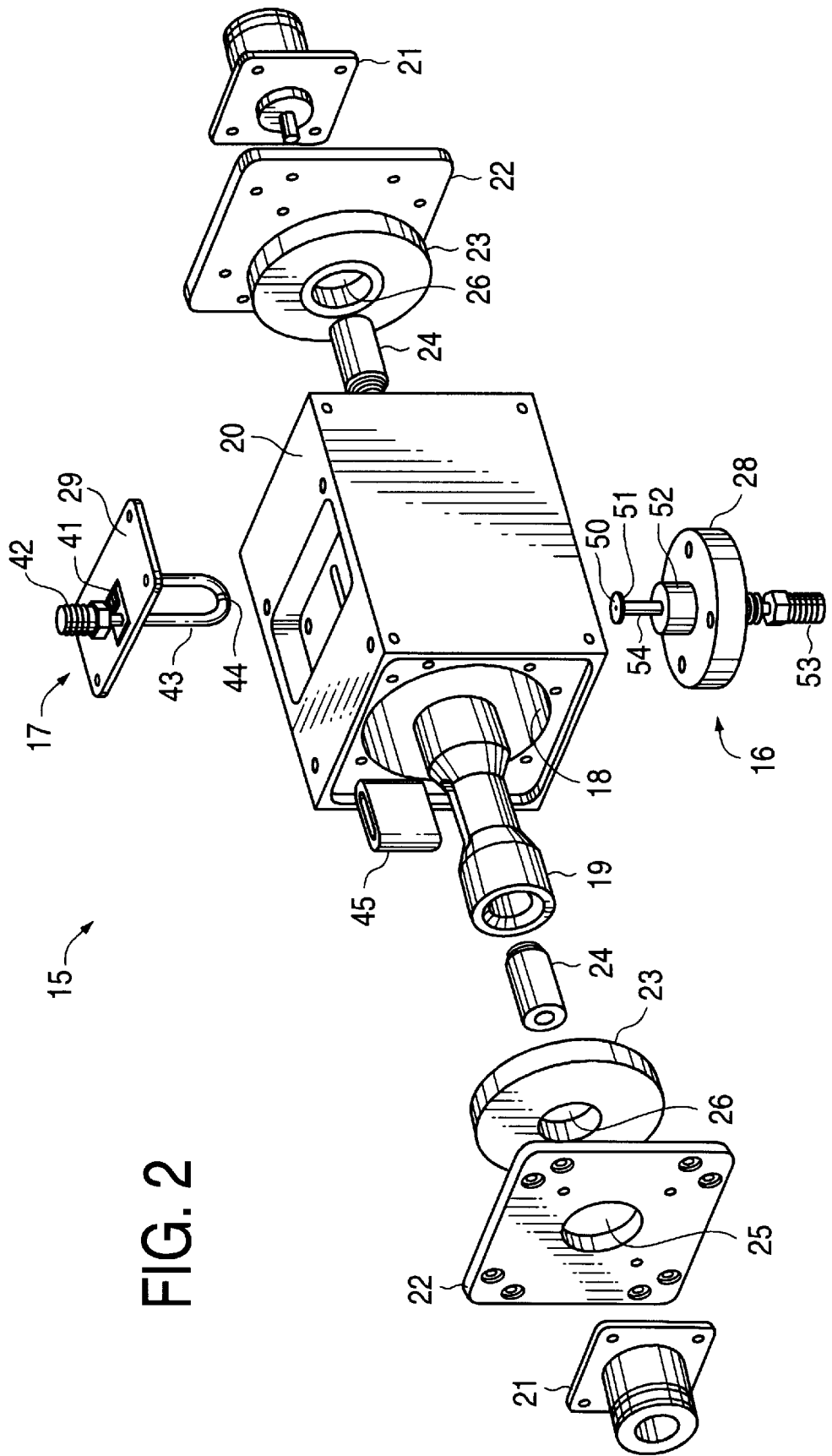
FIG. 2 is a pictorial diagram showing an exploded view of the various components of the RF sensor of the preferred embodiment, including a voltage sensing assembly and a current sensing assembly.
Figure 3:
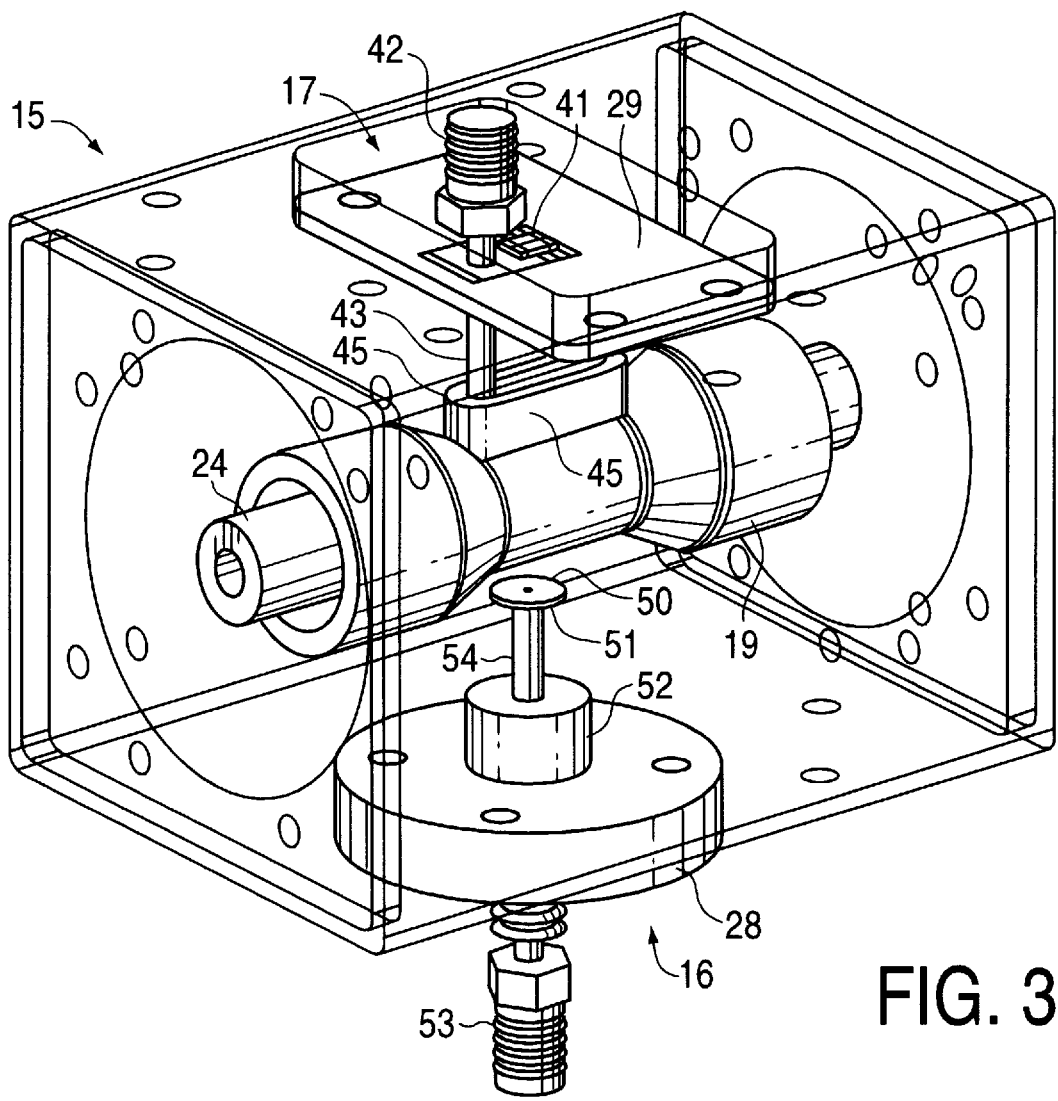
FIG. 3 is a pictorial diagram showing an assembled view of the various interior components of the RF sensor shown in FIG. 2.

Referring to FIGS. 2 and 3, the sensor 15 of the preferred embodiment is shown. FIG. 2 is an exploded view of the various components of the sensor 15, while FIG. 3 is an assembled view. A sensor housing 20 is used to house the various component parts of the sensor 15. The housing 20 of the preferred embodiment is a rectangular-shaped box having an input at one end and an output at the opposite end. A center conductor 19, which resides within the housing 20, provides the conducting medium for the center (or inner) conductor of the transmission line 14. Thus, the center conductor 19 becomes the driven part of the main transmission line 14, between the input and output ends of sensor 20. An input/output (I/O) connector 21 at each end of the housing 20 is mounted onto a respective end plate 22, which is then mounted onto the respective end of the housing 20. One end of the I/O connector 21 couples to the transmission line 14, while the other end extends into an opening 25 of the end plate 22 to couple to the center conductor 19. A conducting sleeve 24 is utilized to mate the plug end of the connector 21 to the center conductor 19, which has a larger diameter opening than the plug. An insulating washer 23, having a central opening 26, is utilized to centrally support the center conductor 19 in position within the housing 20 at each end, when each connector 21 and end plate 22 are mounted onto the housing 20. Screws, bolts or other fastening devices are used to mount the connectors 21 onto the end plates 22 and the end plates 22 onto the housing 20.

The voltage probe 16 and the current probe 17 are mounted substantially midway between the two ends of the housing 20, but disposed at opposite sides of the housing 20 from each other. As noted in FIGS. 2 and 3, both the voltage probe 16 and the current probe 17 are mounted onto the housing 20 and each has a respective cover plate 28 or 29, to mount the assemblies 16–17 into the housing 20. Each of the probe assembly 16 or 17 has a respective connector 53 or 42, which extends through the respective cover plate 28 or 29 for providing external connections, similar to the I/O connectors 21.

Once the sensor assembly 15 is completely assembled, it is encased as a box having connectors for four external connections, two end connections for the main transmission line 14 and one each for the two probes 16–17. The housing 20 and the various plates 22, 28–29 are made from metallic material to shield the internal components from the external environment. The housing 20 provides a return path for the transmission line 14, which return path is typically at ground potential (electrical ground). Although shown with the square end plates 22 and a rectangular body for housing 20, the actual shape of the housing 20 is a design choice. However, an interior surface 18 of the housing 20 is cylindrical and concentric for receiving the cylindrically shaped center conductor 19.

It is appreciated that in the preferred embodiment, a cylindrically-shaped center conductor and concentrically shaped inner housing surface are used to facilitate the design. However, the present invention can use other shapes as well. For example, square or rectangular conductors can be used so that the internal cross-section is rectangular (or square), rather than circular. A different set of equations would be utilized to solve for the characteristic impedance, flux density, etc.

The center conductor 19 is cylindrical so that when placed within the housing 20, it is positioned concentrically in the center within the interior surface 18 by the positioning support provided by the washers 23. The pair of insulating washers 23 are fabricated from a non-conducting material so that it can support the center conductor 19 within the housing 20 and prevent an electrical short of the center conductor 19 to the surface 18, which forms part of the return path for the transmission line 14. It also improves the characteristic impedance match in the transition region between the sensor and the connector. In the preferred embodiment, TEFLON® material is used as the material for the washers 23, partly since it has the desirable dielectric constant for the above-described task.

The center conductor 19 functions equivalently to a center conductor of a coaxial transmission line, while the housing body 20 (including the interior surface 18) functions equivalently to a shielded return (ground path) of the same coax. Accordingly, the interior surface 18 of the housing 20 is also referred to as the outer conductor 18. However, where most coaxial transmission lines utilize a solid material as a dielectric between the two conducting paths, the sensor 15 utilizes air between the center conductor 19 and the outer conductor 18.

Figure 4:
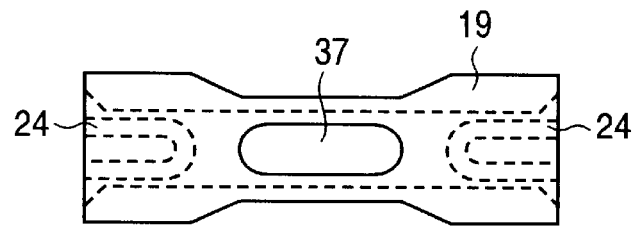
FIG. 4 is a top plan view of a center conductor within the RF sensor that is used as part of a transmission line when the RF sensor is coupled to the system of FIG. 1.

The center conductor 19 is also shown in finer detail in FIG. 4. The conductor 19 is hollow throughout. Thus, when completely assembled and coupled, the conducting paths of the transmission line 14 mate to the sleeves 24, which then mate to the center conductor 19. The conducting path is along the outer wall of the center conductor 19, due to the skin effect. Thus, making the conductor 19 hollow does not affect the current flow, but allows for insertion of the current probe 17, as noted below. The conductor 19 has an elongated opening 37 located midway between the two ends. The opening 37 extends to the hollow center so that the conductor 19 can receive a portion of the current probe 17 into its hollow center.

Figure 5:
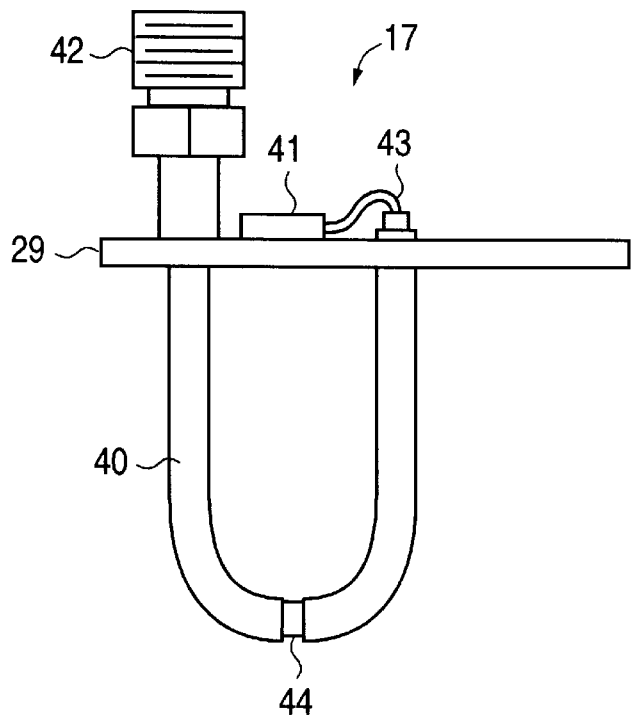
FIG. 5 is a plan view of the current sensing assembly shown in FIGS. 2 and 3.

The current probe 17, which is shown in more detail in FIG. 5, includes a U-shaped pickup coil (or coil loop) 40, the plate 29, termination 41 and connector 42. The pickup coil 40 is a coaxial transmission line, having a center conductor surrounded by a conducting return. Although a typical coaxial cable with a braided return can be used, the coil loop 40 of the preferred embodiment utilizes a solid metal outer casing surrounding an inner conductor. This outer casing is coupled to the plate 29 at the termination end, and to the plate 29 and the connector 42 at the other end. The inner conductor 43 of the coil 40 is coupled to the inner conductor of the connector 42 at one end and to the termination 41 at the other. The termination 41 is a circuit component (such as a resistor) for providing a matching termination impedance at the end of the coil 40. The termination impedance should match the characteristic impedance of the coil 40 (for example, 50 ohms) and the same applies to the impedance presented by the measuring device 9 of FIG. 1 coupled to the connector 42. Thus, the center conductor of coil 40 is terminated at both ends by its characteristic impedance. The outer casing of the coil 40 has a cut (or slit) 44 at the apex of the U-shape to fully break the electrical connection of the casing at the apex. Thus, centrally disposed, the cut 44 is located at the mid-point of the coil 40. It is to be noted that only the casing is cut and not the inner conductor of the coil 40.

When the current probe 17 is assembled and disposed within the housing 40, the central portion of the coil 40, having the cut 44, is inserted into the opening 37 of the center conductor 19, as shown in FIG. 3. An insulating sleeve 45 is inserted into the opening 37 of conductor 19 and the apex of the U-shaped coil 40 (having cut 44) is inserted into the sleeve 45. The insulating sleeve electrically insulates the coil casing (which is at ground potential) from the conductor 19. The cut 44 resides within the insulating sleeve 45. In the preferred embodiment, insulating sleeve 45 is fabricated from a TEFLON® material. This material is used since it has the desirable dielectric constant for providing the impedance matching in the transition region.

The plate 29 is mounted onto the housing 20 and forms part of the return path for the transmission line 14. Thus, the casing of the coil 40 is grounded at both ends, but does not form a continuous ground path, since the cut 44 is present. The plate 29 is then mounted onto the housing 20.

Figure 6:
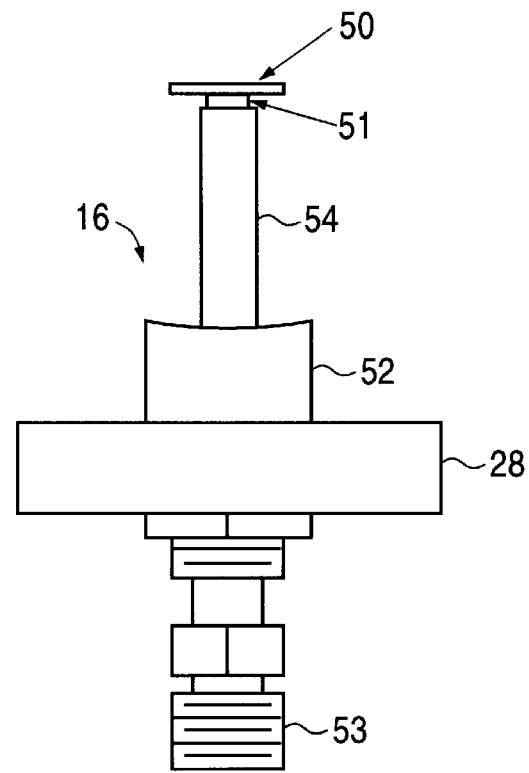
FIG. 6 is a plan view of the voltage sensing assembly shown in FIGS. 2 and 3.

The voltage probe assembly 16, which is shown in more detail in FIG. 6, includes a flat conducting plate 50 coupled to an inner conductor 51 of a coaxial line 52. The other end of the coax line 52 is coupled to a connector 53 mounted onto the cover plate 28. The measuring device 9 of FIG. 1 is coupled to connector 53 to measure the voltage sensed by the voltage probe 16. When installed, the coax line 52 will have the same impedance as the external line coupled to the connector 53 and the measuring device 9 will be impedance matched as well. Accordingly, the impedance is matched from the measuring device 9 all the way to the tip of the conductor 51 where it mates (typically soldered) to the plate 50.

When the voltage probe assembly 16 is assembled into the housing 20 by mounting the cover plate 28 thereon, the flat plate 50 is made to reside proximal to the center conductor 19, but not touching the center conductor 19 nor touching the outer conductor 18. The plate 50 is positioned at approximately the midway point along conductor 19, similar to the current probe 17. In the preferred embodiment, the voltage probe 16 is positioned at the opposite side of the conductor 19 from the current probe 17. It is desirable to obtain current and voltage sensing at the same linear location on the center conductor 19 so that accurate power measurements (P=V * I) can be made.

The flat plate 50 can be of a variety of shapes, but is shown in the Figures as circular in shape. The coupling of the conductor 51 to the plate 50 can be achieved at anywhere along the surface, but is generally preferred to do so at the center of the circular plate 51. The plate 50 is fabricated from a conducting material (such as copper, brass and silver), generally used as a plate of a capacitor, since that is the function of the plate 50. That is, the plate 50 functions as one plate of a capacitor. The other plate of the capacitor is formed by the center conductor 19 in one instance and by the outer conductor 18 in the other instance.

Figure 7:
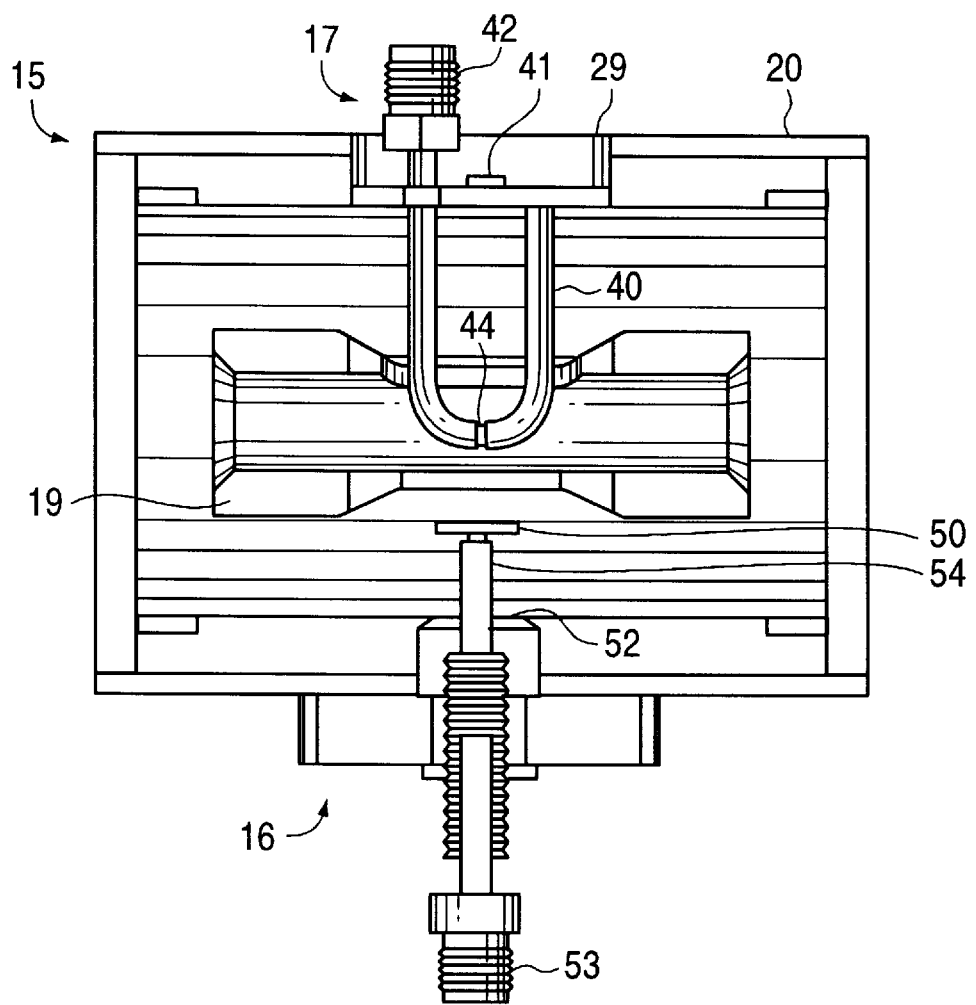
FIG. 7 is a cut-away view of a fully assembled RF sensor shown in FIGS. 2 and 3.

FIG. 7 illustrates a cross-sectional view of a completely assembled sensor unit 15, showing the positioning of the current pickup coil 40 within the hollow center section of the center conductor 19 and the positioning of the capacitive plate 50 in the air gap separating the center conductor 19 and the outer conductor 18. The plate 50 is positioned proximal to the outer surface of inner conductor 19 opposite coil 40. The descriptions on the workings of the two probes 16 and 17 are described below.

Current Probe

Figure 8:
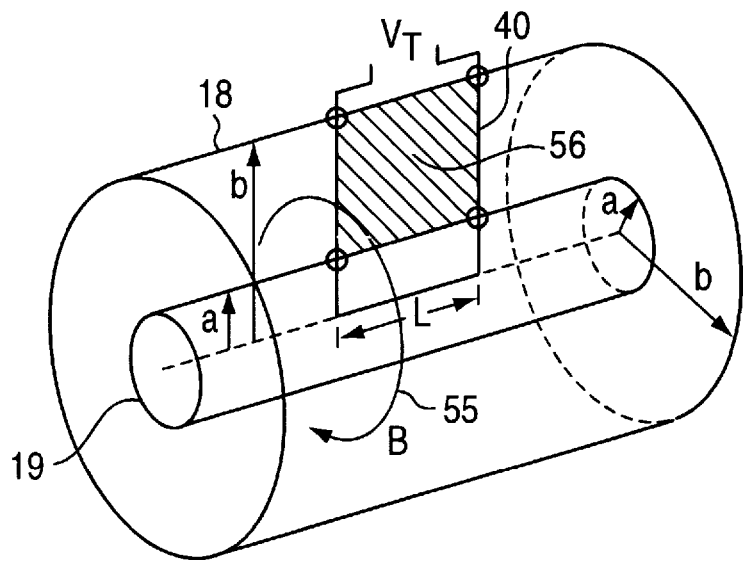
FIG. 8 is a pictorial representation showing flux linkage by a current pickup coil of the current sensing assembly when the coil is assembled into position between the center conductor and an outer conductor in the RF sensor housing.
Figure 9:
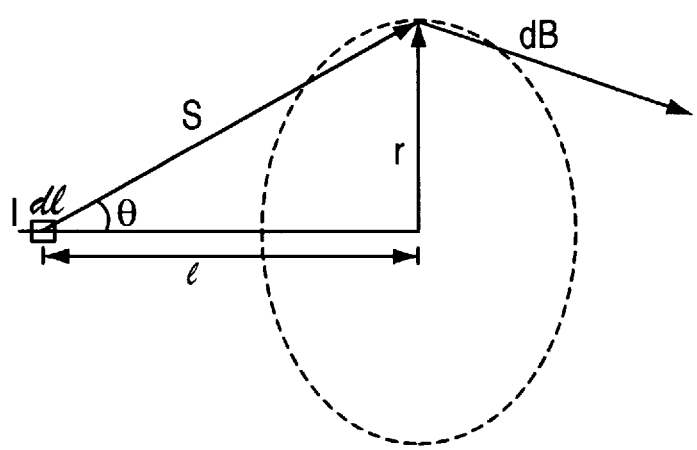
FIG. 9 is a diagram showing the mathematical parameters used to solve equations for a moving unit of charge on a transmission line.

Principles of the operation of the current probe 17 of the present invention is described below in reference to FIGS. 8–10. The diagram of FIG. 8 shows that portion of the sensor 15 which is applicable for the measurement of the current through the center conductor 19. The diagram shows two concentric cylinders, in which the hollow center conductor 19 is shown as the inner cylinder and the outer conductor 18 of the housing 20 is shown as the outer cylinder. The pickup coil 40 is shown disposed in place having its cut end inserted into the hollow center of the conductor 19.

The current probe 17 is based on an application of the Faraday's Law, which states that the electromotive force (emf) induced in a conducting loop is the negative of the time derivative of the magnetic flux enclosed by the loop. Accordingly, if all of the flux lines 55 produced along a known length of wire carrying an alternating current (AC) are linked, then the current in the wire can be explicitly determined by measuring the terminal voltage of the loop. This principle is combined with Amperes Law, which states that the integral of the magnetic flux density around a closed path is equal to R times the net current across the area enclosed by the path.

In an coaxial transmission line where the current on the inner and outer conductors are equal and opposite, such as that formed by conductors 18 and 19 in the sensor 15 of the preferred embodiment, the flux is zero outside the outer conductor of the transmission line. Furthermore, since the center conductor 19 is hollow, the flux inside the hollow center of the center conductor 19 is also zero. This is due to the current flow being along the outer surface of the center conductor 19. Thus, in the sensor assembly 15, all flux 55 would reside between the boundaries formed by the outer surface of the center conductor 19 and the interior surface (outer conductor) 18 of housing 20, which flux 55 is shown as magnetic field B (using the right-hand rule) in FIG. 7.

Accordingly, it follows that a wire loop inserted into this confined space between the two conductive regions 18 and 19 will link all of the flux 55 generated by the current through the conductors. By knowing the flux linkage area (shown by shaded area 56 in FIG. 8) associated with the current flow in the center conductor 19 precisely, the voltage induced in the loop can be determined from fundamental physical laws associated with the geometry of the components of the sensor. Stated differently, the physical components comprising the transmission line and the current probe 17, will determine the direct relationship between the actual current flowing in the conductor 19 and the voltage induced in the coil 40. Furthermore, since this relationship is based on the principles of fundamental laws stated above, the current probe 17 would be based on the first principles. Accordingly, calibration adjustments based on the relative positioning of the current loop to the transmission line are not needed. It is to be noted that many prior art current pickup coils, which are positioned proximal to the main transmission conductor of a transmission line, require considerable and/or frequent calibration/adjustment in order to obtain an accurate indication of the current. No such adjustment is necessary with the current probe of the preferred embodiment, since it is based strictly on the first principles.

As is shown in FIG. 8, the area 56 associated with the flux linkage resides between the inner wall of the conductor 18 and the outer wall of the conductor 19 along a length L. The length L is the length of the conductor 19 transcended by the coil 40. Thus, physical dimensions of the components shown in FIG. 8 determine the induced voltage in the current sensing loop. The current measurement is not based on the exact placement of the pickup coil relative to the current carrying center conductor 19. As long as all of the flux 55 generated by the current flow in the center conductor 19 is linked to the pickup coil 40, calibration of the current probe is not necessary. By having the coil extend into the hollow center of the center conductor 19, assurance is made to link all of the flux 55 within length L of coil 40.

The mathematical derivation of the coupling in S.I. units for such a loop for area 56 is described below and is better understood when referenced to FIG. 9. For a long wire carrying a current 1, the differential magnetic flux density dB at a radius r from the wire at a distance S from a unit of moving charge is from the Biot-Savart law to be $$dB = \frac{\mu_o}{4\pi} \frac{Idl \times ds}{S^2}.$$

Since the vector cross product is the product of the length of the two vectors times the sine of the subtended angle in the direction normal to their plane (right hand rule), it follows that $$dB = \frac{\mu_o I}{4\pi} \frac{\sin(\theta) dl}{S^2}.$$

Thus, B equals the integral of dB along l from l=−∞ to +∞. Evaluation of this integral becomes much more convenient if the expression is re-written in terms of r and θ. From the diagram, $$S = \frac{r}{\sin\theta} \text{ and } l = \frac{-r}{\tan\theta}.$$

Differentiating l with respect to θ results in $$dl = \frac{r}{\sin^2\theta}$$

and substituting into the above equation results in $$B = \frac{\mu_o I}{4\pi} \int_0^\pi \frac{(\sin\theta)\frac{r}{\sin^2\theta}}{\frac{r^2}{\sin^2\theta}} d\theta,$$

which equals $$B = \frac{\mu_o I}{4\pi r} \int_0^\pi \sin\theta d\theta = \frac{\mu_o I}{4\pi r} [-\cos\theta|_0^\pi].$$

The final result is $$B = \frac{\mu_o I}{2\pi r}.$$

In order to obtain the flux Φ over a square area of the pickup loop inside the coax where B is non-zero, namely between the outer surface of the center conductor 19 and the interior surface 18, B is integrated over a radius of "a" (radius from the concentric center of the conductors 18–19 to the outer surface of the center conductor 19) to "b" (radius from the center to the interior surface of the outer conductor 18) along a length L (linear length of the transmission line covered by the length of the loop), as illustrated in FIG. 8. Thus, in the following equation steps, Φ is determined as follows.

$$\Phi = \int B_n dA = \int_a^b \int_o^L \frac{\mu_o I}{2\pi r} dr dl$$

$$\Phi = \frac{\mu_o I}{2\pi} \int_a^b \frac{dr}{r} [l|_o^L]$$

$$\Phi = \frac{\mu_o I L}{2\pi} [\ln r|_a^b] = \frac{\mu_o I L \ln\left(\frac{b}{a}\right)}{2\pi}.$$

When Faraday's Law is applied $$emf = \frac{-d}{dt} \Phi = \frac{-\mu_o L \ln\left(\frac{b}{a}\right)}{2\pi} \frac{dI}{dt}.$$

Now for I=$I_0$ cos(ωt), where ω is the radian frequency of 2πf and $I_0$ is the sensed current signal, $$emf = \frac{-\mu_o L \ln\left(\frac{b}{a}\right)}{2\pi} [-\omega\sin(\omega t)] = I_o \mu_o L \ln\frac{b}{a} f \sin(\omega t)$$

which in phasor form is $$j\mu_o f \ln\frac{b}{a} L I_o.$$

However, the above analysis ignores the fact that the pickup loop would also be subjected to a capacitive coupling to the inner conductor, which then would corrupt the current signal as soon as the inductance of the pickup loop becomes non-zero. This problem is solved by using a coaxial pickup loop, having its outer conductor of the pickup loop grounded to the outer conductor of the power carrying coax at both ends. The cut 44 in the outer conductor of the pickup loop 40 allows it to act as a Faraday Shield, effectively keeping the electric field from reaching the center conductor of the pickup loop. Hence, the loop signal is purely inductive. The cut 44 in the pickup coax's outer conductor prevents the flow of inductively driven current in the shield so that the magnetic flux is not excluded from the center of the loop.

Figure 10:
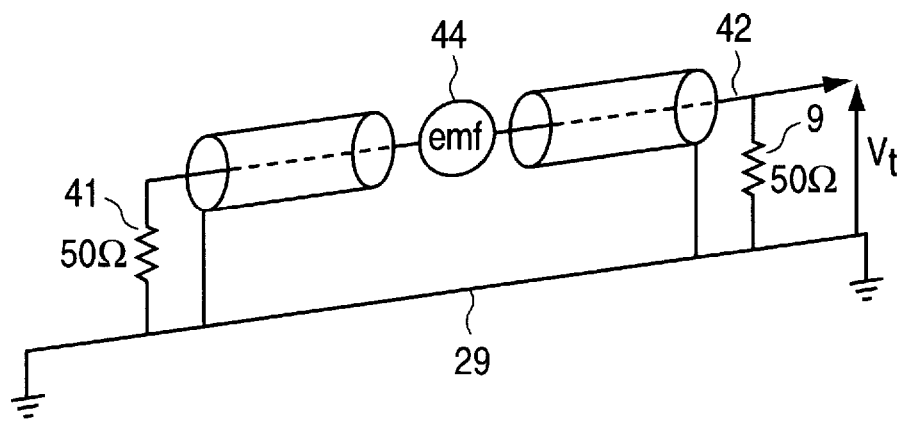
FIG. 10 is a diagram showing the implementation of a Faraday Shield in the operation of the current sensor of the preferred embodiment.

The application of the Faraday Shield is illustrated in FIG. 10. In the pickup coil 40 of the preferred embodiment, the outer casing of the coil 40 includes the cut 44 to operate as an effective Faraday Shield to prevent the flow of capacitively driven current in the coil 40. It is imperative that the loop casing be cut at the exact center and the cut 44 should be as narrow as possible, preferably no more than 1 mm wide. This also implies that the two inner conductor ends of the coil 40 should be well terminated in the characteristic impedance (such as 50 Ω resistance). Thus, one end is terminated to termination 41 having the characteristic impedance and the other end is terminated to the measuring device 9, which also has the characteristic impedance. It is preferred to maintain leads to a short length in order to minimize stray inductance.

The pickup loop circuit is essentially comprised of two sections of terminated coax with a series voltage source in the middle (as shown in FIG. 10). The voltage Vt, measured at the connector 42, is directly related to the current flowing through the center conductors 9. Accordingly, $$Vt = \frac{j\mu_o f L \ln\left(\frac{b}{a}\right) I_o}{2}.$$

The final current value is then determined as $$I_o = \frac{-j2Vt}{\mu_o f L \ln\left(\frac{b}{a}\right)}.$$

The use of carefully configured coupled transmission lines, which is necessary to produce an RF sensor with first principles of coupling, also results in a current probe which is passive, totally linear, dissipates no power, and is not intrusive to the extent that an equivalent length of air dielectric coaxial transmission would be.

Additionally, the center conductor 19 (see FIG. 4) of the preferred embodiment utilizes a central section, where the coil 40 is inserted, having a smaller outer radius than the end sections. The presence of the pickup coil 40 into the hollow center of the conductor 19 will cause the line impedance of the center conductor 19 to decrease. However, by reducing the diameter (thus, reducing radius "a") at this point permits the line impedance to be compensated and maintained at the desired characteristic line impedance along the current sensing region. Accordingly, the center conductor 19 has a reduced radius at the current sensing region to maintain the characteristic line impedance of the termination line. It should also be emphasized that the current sensor 17 actually measures the derivative of the actual current, since it is actually voltage Vt that is being measured.

Voltage Probe

Figure 11:
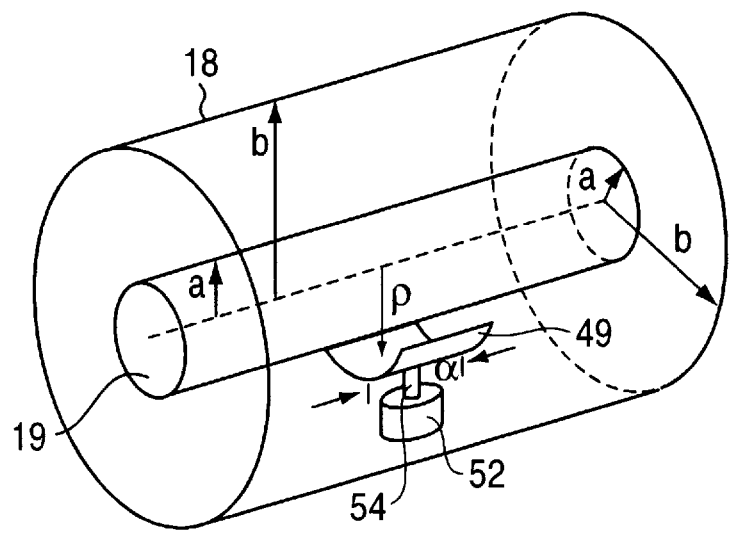
FIG. 11 is a pictorial representation showing the presence of a curved capacitive plate, having a bend radius ρ and positioned between the center conductor and the outer conductor in the RF sensor housing to provide voltage sensing.
Figure 12:
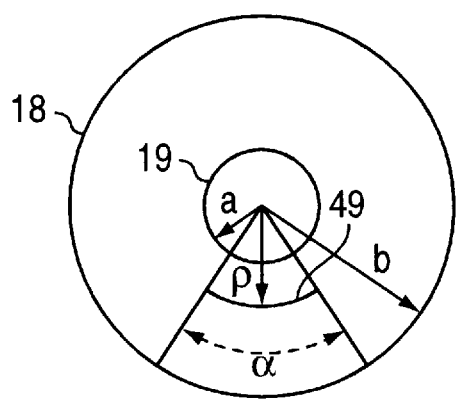
FIG. 12 is a cross-sectional diagram of FIG. 11 and showing the placement of the capacitive plate between the center and outer conductors of the RF sensor.
Figure 13:
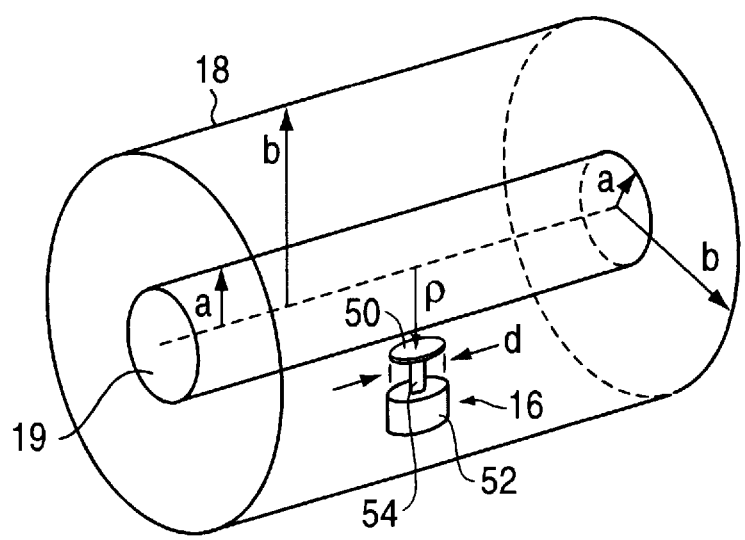
FIG. 13 is a pictorial representation of the preferred embodiment in which a flat capacitive plate is used, instead of the plate shown in FIG. 11, for sensing the RF voltage.

Referring to FIG. 11, an equivalent transmission line diagram as FIG. 8 is shown and a cross-sectional diagram of FIG. 11 is shown in FIG. 12. Instead of a flat plate 50, a square plate 49 having a curved surface of bend radius ρ is used for the calculations noted below. As noted, the voltage probe 16 is disposed at about the same point along the conductor 19 as the current probe 17. The preferred embodiment, which is shown in FIG. 13, utilizes the flat plate 50. The plates are positioned adjacent and planar to the linear direction of the outer surface of the center conductor 19 to operate as capacitive plates. As shown in FIGS. 11–12, the distance from the concentric center of the conductor 19 to the surface of plate 49 adjacent to conductor 19 is noted as distance "ρ", so that the separation distance (air dielectric distance) between the plate 49 and conductor 19 is the distance ρ minus a (ρ-a). The width of the plate 49 (in this instance, the linear length along the axial or longitudinal direction of the center conductor) is defined as distance "d" in the Figures.

It is appreciated that the calculations noted below derive results based on the equidistant dielectric separation of the plate 49 from the conductor 19. The invention is thus operative utilizing the plate 49. However, due to manufacturing simplification and since the overall error is slight, the flat plate 50 is actually the preferred element for providing the capacitive coupling in relation to the conductor 19.

Figure 14:
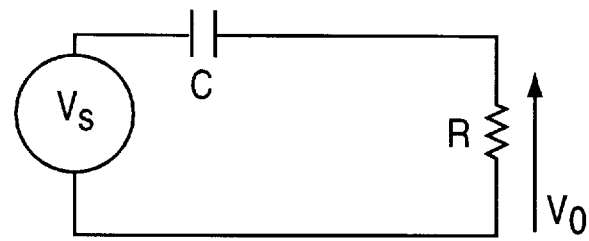
FIG. 14 is a circuit schematic diagram for exemplifying an equivalent circuit when a capacitive coupling technique of the present invention is used, in which a resistive leg of a R-C circuit is used to measure voltage.

Since the current probe 17 actually senses the derivative of the current flowing in the conductor 19, it is desirable to have a differentiating voltage sensor as well so that the phase relationship between V and I retains the proper phase relationship to each other when sensed. Accordingly, the equivalent circuit for measuring the voltage of the transmission line is shown in FIG. 14. The voltage on the center conductor 19 is represented as source Vs and the voltage measured at connector 53 is equivalent to the voltage $V_T$ across the characteristic impedance R. The capacitance C represents parasitic capacitance in the measuring circuit. The voltage sensing arrangement is thus comprised of a R-C differentiator circuit shown in FIG. 14, wherein the value for $V_T$ is determined as $$V_T = \frac{VsR}{R + \frac{1}{j\omega c}} = Vs \frac{j\omega RC}{1 + j\omega RC}.$$

If $1/\omega C$ is much larger than R, then $V_T \approx j\omega RCVs$, which is in the same form as the current measurement signal $V_T$, so that phase shift adjustments are not needed when comparing the measured V and I signals.

In order to reduce or remove parasitic elements and imperfections of manufactured capacitors, the voltage probe of the present invention also uses principles applicable to transmission lines. By terminating a transmission line in its characteristic impedance, it is possible to present that characteristic impedance to a source at any distance from the actual load. Therefore, parasitic inductance and capacitance associated with connecting the source to the load are minimized. A parallel plate air dielectric capacitor is also very nearly an ideal capacitor when the plate dimensions are small as compared to the signal wavelength. Accordingly, as described in the earlier Figures, the voltage probe 16 is a piece of terminated coax 52 with a plate 50 fastened to the center conductor 51 at the probe end. The plate 50 is then brought into proximity of the center conductor 19 and positioned opposite the center of the current pickup coil 40. Coaxial insulation 54, separating the two coaxial conductors, is retained almost to the tip, so that only a short length of the conductor 51 is exposed in order to insure that the characteristic impedance of the line is maintained.

Figure 15:
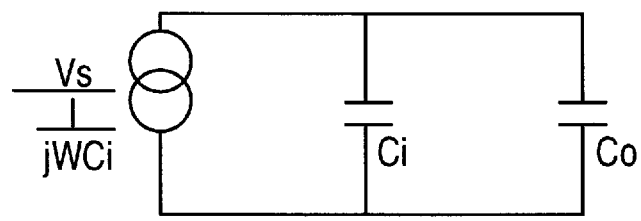
FIG. 15 is a circuit schematic diagram showing an equivalent circuit for the capacitively coupled voltage sensor of the preferred embodiment when the capacitive plate is disposed between the center and outer conductors.
Figure 16:
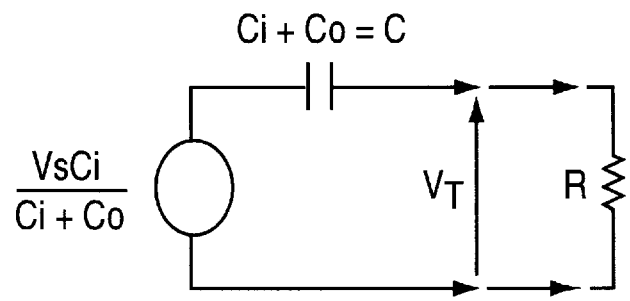
FIG. 16 is a circuit schematic diagram showing another equivalent circuit as FIG. 15 and showing the measurement of voltage across a resistive leg of the R-C circuit.

As shown in FIG. 15, the voltage to be sensed (Vs) is divided between a capacitance Ci (capacitance from the center conductor 19 to the plate) and a capacitance Co (capacitance between the plate and the outer conductor 18). A transformation of an equivalent circuit results in a current source of $$\frac{Vs}{\frac{1}{jWCi}},$$

which drives the two parallel capacitances Ci and Co. Transforming this back to a Thevenin's equivalent circuit results in a voltage source with series impedance Ci and Co (where C=Ci+Co), as shown in FIG. 15. When coupled to the characteristic impedance R of the transmission line 51, it can be represented by the simplified schematic of FIG. 16

The terminal voltage $V_T$ measured at the connector 53 is then $$V_T = \frac{\frac{VsCiR}{Ci + Co}}{R + \frac{1}{j\omega(Ci + Co)}} = Vs \left[ \frac{j\omega RCi}{1 + j\omega R(Ci + Co)} \right].$$

Separating this equation into real and imaginary parts $$V_T = Vs \left[ \frac{\omega^2 R^2 Ci(Ci + Co) + j\omega RCi}{1 + \omega^2 R^2 (Ci + Co)^2} \right].$$

Observing that $(Ci+Co)=Ci(1+Co/Ci)$ and defining a geometry constant $Kg=Co/Ci$, $V_T$ can be written as $$V_T = Vs \left[ \frac{\omega^2 R^2 Ci^2 (2 + Kg)}{1 + \omega^2 R^2 Ci^2 (1 + Kg)^2} + \frac{j\omega RCi}{1 + \omega^2 R^2 Ci^2 (1 + Kg)^2} \right].$$

Then, defining ω0 to be an arbitrary constant represented as ω0=1/RCi, the equation then becomes $$V_T = Vs \left[ \frac{\frac{\omega^2 (1 + Kg)}{\omega o^2}}{1 + \frac{\omega^2}{\omega o^2}(1 + Kg)^2} + \frac{\frac{j\omega}{\omega o}}{1 + \frac{\omega^2}{\omega o^2}(1 + Kg)^2} \right]$$

$$V_T = \frac{Vs}{(1 + Kg)} \left[ \frac{\frac{\omega^2 (1 + Kg)^2}{\omega o^2}}{1 + \frac{\omega^2}{\omega o^2}(1 + Kg)^2} + \frac{\frac{J\omega (1 + Kg)}{\omega o}}{1 + \frac{\omega^2}{\omega o^2}(1 + Kg)^2} \right]$$

$$V_T = \frac{Vs}{(1 + Kg)} \left[ \frac{1}{1 + \frac{\omega o^2}{\omega^2 (1 + Kg)^2}} + \frac{\frac{j\omega o}{\omega (1 + Kg)}}{1 + \frac{\omega o^2}{\omega^2 (1 + Kg)^2}} \right]$$

-continued $$V_T = \frac{Vs}{(1+Kg)} \left[ \frac{1}{1 + \frac{\omega o^2}{\omega^2(1+Kg)^2}} + \frac{j}{\frac{\omega o}{\omega(1+Kg)} + \frac{\omega(1+Kg)}{\omega o}} \right]$$

wherein $\theta_{VT}$ is then defined as the phase angle of $V_T$, so that $$\theta_{VT} = \tan^{-1}\left[\frac{ImV_T}{ReV_T}\right] = \tan^{-1}\frac{\omega o}{\omega(1+Kg)}$$

$$\text{and } |V_T| = \frac{\frac{Vs}{(1+Kg)}\left[\frac{1}{\frac{\omega o}{\omega(1+Kg)} + \frac{\omega(1+Kg)}{\omega o}}\right]}{\operatorname{Sin}\left(\tan^{-1}\left(\frac{\omega o}{\omega(1+Kg)}\right)\right)}$$

For a coupling factor of –60 db (which is the ratio of the voltage coupled to the sensor versus what is present on the transmission line of conductor 19), $\omega 0$ is 1000 times greater than $\omega$ and within 0.1%. Wherein when $\omega<<\omega 0$, the voltage sensor response simplifies to $V_T \approx jVs\omega RCi$, and $$Vs \approx \frac{-jV_T}{\omega RCi}.$$

In order to apply the above analysis for the capacitance in terms of actual physical dimensions of the voltage probe 16, the following is considered. Fields texts provides that the capacitance per unit length of a cylindrical coaxial capacitor as $$\frac{2\pi\epsilon}{\ln\left(\frac{b}{a}\right)},$$

where a and b relate to the radii of the conductive surfaces.

A model of the voltage probe would then appear as two short coaxial capacitors in series with a small subtended angle $\alpha$ (rather than $2\pi$ radians), as shown in FIG. 12. Capacitance Ci would then be $$Ci = \frac{\alpha\epsilon d}{\ln\frac{\rho}{a}}$$

and Co would be $$\frac{\alpha\epsilon d}{\ln\left(\frac{b}{\rho}\right)}.$$

Figure 17:
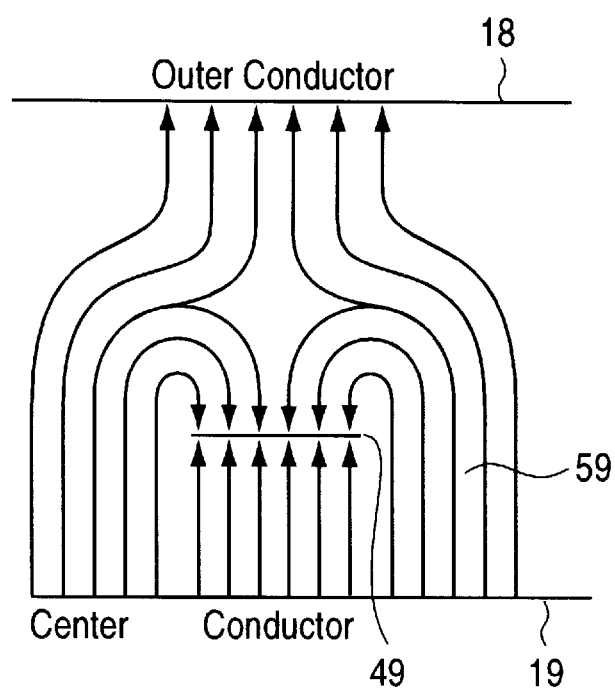
FIG. 17 is a pictorial diagram showing a qualitative disposition of electric flux lines about the capacitive plate of the voltage probe of the preferred embodiment.

However, this simple model neglects the fact that the pickup plate 49 is very short as compared to the length of the power carrying cylinders and that it is held to near ground potential by its load resistor R (Typically, R=50 Ω). Under this condition, the electric flux lines 59 from the center conductor 19 have access to the rear side of the pickup plate 49, as well as the side facing the center conductor, as shown in FIG. 17. The ground potential at the outer wall is considerably distant compared to the back side of the pickup plate 49. Under this condition, nearly all of the electric flux lines 59 originating near the plate 49 terminate on the plate 49 and both sides of the plate contribute to Ci while Co is very nearly zero. Accordingly, the exact model for Ci becomes almost intractable, but can be approximated as $$\frac{2\alpha\epsilon d}{\ln\left(\frac{\rho}{a}\right)}$$

as Kg approaches a small value.

To evaluate the accuracy of the model, a network analyzer was used to set a sensor's voltage coupling at –60 db or 1 mV/V. Then, Vs=j1000 $V_T$ when loaded with 50 ohms. Then, using the pickup disk plate 50 of the preferred embodiment, which had a diameter of 6.4 mm, the distance of the plate 50 from the center conductor 19 was noted at approximately 2.2225 mm (this is the distance ρ- a). The inner radius "a" was approximately 5.675 mm and the outer radius "b" was approximately 19.35 mm. The value for ρ is then, ρ=a+2.2225 mm=7.8975 mm. The cylindrical model assumes a square pickup plate with a bend radius of ρ. If it is assumed that this pickup plate as a square contained within a tangent to a circle of radius 3.22 mm, then the sides of the square will be $\sqrt{2}$ times the radius and the area ratio of the circle to the square will be $\pi/2$. The subtended angle is then $$\alpha = \frac{3.2\sqrt{2}}{7.8975} = 0.57303.$$

Recalling that $$Vs = \frac{-jVt}{\omega RCi}, \text{ then}$$

$$Vs = \frac{-jV_T}{2\pi fr\left(\frac{2\alpha\epsilon d}{\ln\left(\frac{\rho}{a}\right)}\right)\frac{\pi}{2}} \text{ and}$$

$$Vs = \frac{-jV_T\ln\left(\frac{\rho}{a}\right)}{2\pi^2 fR\alpha\epsilon d} = -j1075.47 V_T.$$

The approximate discrepancy between the measured value for plate 50 versus the calculated value (using plate 49) is 0.7%, which is within an acceptable tolerance for most measurements. Thus, the operative calculations (based on the plate 49 parameters) have been verified through experimentation to be applicable to the plate 50 of the present invention. Again, it is to be noted that either plate design can be utilized to practice the present invention.

One final consideration is the lack of obtrusiveness of the voltage sensor 16. A sensor can only be unobtrusive if it has the same characteristic impedance as the transmission path and it does not change the length of the path. Typically in the post-match environment, the characteristic impedance of the signal path is both unknown and varies along the path because the geometry is changing as well. Also, it is usually difficult, or impossible, to avoid changing the length of the path. The best compromise is to make the sensor 16 as short as possible and use a known and controlled impedance so that the obtrusiveness of the sensor can be quantified. An impedance of 50 ohms was chosen because of the availability of test equipment using this impedance. Since conductors and contact areas are large, the sensor dissipates essentially no power. Accordingly, a voltage probe 16 is provided, having enhanced accuracy and controlled phase shifting to match the phase shift in the current sensor 17.

It is appreciated that the current sensor 17 is based strictly on first principles and requires no calibration when constructed to the designed specifications. The voltage sensor 16 also does rely on first principles, but in the present form of implementation, requires a numerical solution based on the plate diameter and gap separation from the conducting medium (which it is attempting to measure). Thus, some amount of calibration is required, but accuracy is improved due to the characterized impedance R being coupled from the measuring device all the way to the plate 50. Since most of the electric field (flux) lines terminate on the plate 50, voltage measurement is obtained by measuring the resistive leg of a R-C differentiator circuit formed by the characteristic impedance and the capacitive reactance of the plate 50 to the center conductor 19.

Thus, an RF sensor having a novel current probe and a novel voltage probe is described.

We claim:

1. A voltage sensor for coupling to a power carrying transmission line to sense voltage on said transmission line, comprising:

a center conductor coupled serially in-line to said transmission line;

a housing surrounding said center conductor to shield said center conductor and to provide a return path for said transmission line;

a plate disposed between said center conductor and said housing, having a first side of said plate proximal to and facing said center conductor, in which said center conductor and said plate function as capacitor plates to form a capacitor;

a sensing line having a characteristic impedance of a resistive load coupled to terminate on an opposite side of said plate, wherein the resistive load of said sensing line and the capacitor forming a resistive-capacitive circuit, said plate being sufficiently short in length as compared to said center conductor, said center conductor being closer to said plate than said housing at a point on said center conductor where said plate is located and the opposite side of said plate being coupled to said resistive load, which places the opposite side of said plate at a potential near that of said housing, allowing for electric flux linkage from said center conductor to be coupled to both sides of said plate to reduce flux loss at the point where said center conductor is sensed;

said sensing line providing a sensing voltage signal which is indicative of transmission line voltage.

2. The voltage sensor of claim 1 wherein said center conductor is axisymmetric in shape and said plate is placed near the center of its axisymmetric-shaped length.

3. The voltage sensor of claim 2 wherein said center conductor is cylindrically-shaped and said plate is placed proximal to a mid-point along said cylindrically-shaped length.

4. The voltage sensor of claim 3 wherein said plate is curved to have a bend radius which is concentric to said cylindrically-shaped center conductor.

5. The voltage sensor of claim 3 wherein said plate is flat on both sides.

6. A radio frequency (RF) voltage sensor for coupling to a power carrying transmission line to sense RF voltage on said transmission line, comprising:

a center conductor for coupling serially in-line to an RF driven conductor of said transmission line, said center conductor coupled at each end to said transmission line;

a sensor housing surrounding said center conductor to shield said center conductor and to provide a return path for said transmission line;

a plate disposed within said housing and having a first side of said plate proximal to and facing said center conductor, in which said center conductor and said plate function as capacitor plates to form a capacitor;

a sensing line having a characteristic impedance of a resistive load coupled to terminate on an opposite side of said plate, wherein the resistive load of said sensing line and the capacitor forming a resistive-capacitive circuit;

said plate being sufficiently short in length as compared to said center conductor, said center conductor being closer to said plate than said housing at a point on said center conductor where said plate is located and the opposite side of said plate being coupled to said resistive load, which places the opposite side of said plate at a potential near that of said housing, allowing for electric flux linkage from said center conductor to be coupled to both sides of said plate to reduce flux loss at the point where said center conductor is sensed;

said sensing line providing a sensing voltage signal which is indicative of transmission line voltage.

7. The RF voltage sensor of claim 6 wherein said center conductor is axisymmetric in shape and said plate is placed near the center of its axisymmetric-shaped length; and said housing also has an axisymmetric shaped inner wall.

8. The RF voltage sensor of claim 7 wherein said center conductor is cylindrically-shaped and said plate is placed proximal to a mid-point along said cylindrically-shaped length; and said housing also has a cylindrically-shaped inner wall.

9. The voltage sensor of claim 8 wherein said actual voltage (Vs) is approximated by an equation $$Vs = \frac{-jVt}{\omega RCi},$$

where Vt is a value of said voltage signal, R is a value of said resistance determined by said characteristic impedance, Ci is a value of a capacitance of the capacitor determined by the flux linkage to said plate and $\omega$ is frequency.

10. The voltage sensor of claim 9 wherein said value of said capacitance Ci is approximated by an equation $$Ci = \frac{2\alpha\epsilon d}{\ln\frac{\rho}{a}},$$

where d is a longitudinal length of said plate along said cylindrically shaped length of said center conductor, $\alpha$ is a distance from a longitudinal center axis along said center conductor to its cylindrically shaped outer surface near where said plate is located, $\rho$ is a distance from said longitudinal axis of said center conductor to said plate, $\alpha$ is an angle formed by a fraction of a circumference subtended by said plate and $\epsilon$ is a dielectric constant of a medium separating said plate from said center conductor.

11. The voltage sensor of claim 9 wherein said plate is flat on both sides.

12. In a processing system in which radio frequency (RF) power is coupled from an RF source to a processing equipment by a transmission line, a method of monitoring RF voltage on said transmission line, comprising the steps of:

providing a center conductor which is coupled serially in-line to said transmission line;

providing a housing which surrounds said center conductor to shield said center conductor and function as a return path for said transmission line;

providing a plate disposed between said center conductor and said housing, having a first side of said plate proximal to and facing said center conductor, in which said center conductor and said plate function as capacitor plates to form a capacitor;

providing a sensing line having a characteristic impedance of a resistive load coupled to terminate on an opposite side of said plate, wherein the resistive load of said sensing line and the capacitor forming a resistive-capacitive circuit;

said plate being sufficiently short in length as compared to said center conductor, said center conductor being closer to said plate than said housing at a point on said center conductor where said plate is located and the opposite side of said plate being coupled to said resistive load, which places the opposite side of said plate at a potential near that of said housing, allowing for electric flux linkage from said center conductor to be coupled to both sides of said plate to reduce flux loss at the point where said center conductor is sensed;

measuring said sensing line which provides a sensing voltage signal indicative of transmission line voltage.

13. The method of claim 12 wherein said center conductor is axisymmetric in shape and said plate is placed near the center of its axisymmetric-shaped length; and said housing also has an axisymmetric shaped inner wall.

14. The method of claim 13 wherein said center conductor is cylindrically-shaped and said plate is placed proximal to a mid-point along said cylindrically-shaped length; and said housing also has a cylindrically-shaped inner wall.

15. The method of claim 14 wherein said actual voltage (Vs) approximated by an equation $$V_S = \frac{-jV_t}{\omega R C_i},$$

where Vt is a value of said voltage signal, R is a value of said resistance determined by said characteristic impedance, Ci is a value of a capacitance of the capacitor determined by the flux linkage to said plate and ω is frequency.

16. The method of claim 15 wherein said value of said capacitance Ci is approximated by an equation $$C_i = \frac{2\alpha\epsilon d}{\ln\frac{\rho}{a}},$$

where d is a longitudinal length of said plate along said cylindrically shaped length of said center conductor, α is a distance from a longitudinal center axis along said center conductor to its cylindrically shaped outer surface near where said plate is located, ρ is a distance from said longitudinal axis of said center conductor to said plate, α is an angle formed by a fraction of a circumference subtended by said plate and ε is a dielectric constant of a medium separating said plate from said center conductor.

17. The voltage sensor of claim 15 wherein said plate is flat on both sides.

* * * * *